(12) United States Patent
Spearing et al.

(10) Patent No.: US 7,679,909 B2
(45) Date of Patent: Mar. 16, 2010

(54) INTEGRAL SWIVEL HYDRAULIC CONNECTORS, DOOR HINGES, AND METHODS AND SYSTEMS FOR THEIR USE

(75) Inventors: Ian Spearing, Columbus, OH (US); Tim Schrader, Columbus, OH (US)

(73) Assignee: Liebert Corporation, Columbus, OH (US)

( * ) Notice: Subject to any disclaimer, the term of this patent is extended or adjusted under 35 U.S.C. 154(b) by 345 days.

(21) Appl. No.: 11/779,709

(22) Filed: Jul. 18, 2007

(65) Prior Publication Data

US 2008/0018212 A1 Jan. 24, 2008

Related U.S. Application Data

(60) Provisional application No. 60/831,489, filed on Jul. 18, 2006.

(51) Int. Cl.
*F28F 7/00* (2006.01)
*H05K 7/20* (2006.01)
(52) U.S. Cl. .................. 361/699; 165/80.4; 361/701
(58) Field of Classification Search .......... 361/698–701
See application file for complete search history.

(56) References Cited

U.S. PATENT DOCUMENTS

| | | | | |
|---|---|---|---|---|
| 3,317,798 A * | 5/1967 | Chu et al. ............... | 361/696 |
| 5,467,250 A * | 11/1995 | Howard et al. ........... | 361/696 |
| 6,164,369 A * | 12/2000 | Stoller .................. | 165/104.33 |
| 6,488,214 B1 | 12/2002 | Nicolai et al. | |
| 6,775,137 B2 * | 8/2004 | Chu et al. .............. | 361/696 |
| 6,819,563 B1 * | 11/2004 | Chu et al. .............. | 361/696 |
| 7,142,425 B2 * | 11/2006 | Tomioka et al. ......... | 361/699 |
| 7,385,810 B2 * | 6/2008 | Chu et al. .............. | 361/679.48 |
| 2001/0042616 A1 * | 11/2001 | Baer ..................... | 165/299 |
| 2004/0100770 A1 * | 5/2004 | Chu et al. .............. | 361/698 |
| 2006/0232945 A1 * | 10/2006 | Chu et al. .............. | 361/724 |

FOREIGN PATENT DOCUMENTS

| | | |
|---|---|---|
| DE | 2457721 A1 | 6/1976 |
| DE | 19825602 A1 | 12/1999 |
| EP | 1167890 A | 1/2002 |
| EP | 1167890 | 3/2004 |

OTHER PUBLICATIONS

International Search Report for Corresponding International Patent Application No. PCT/US2007/073777.
Written Opinion for Corresponding International Patent Application No. PCT/US2007/073777.
International Preliminary Report on Patentability for Corresponding International Patent Application No. PCT/US2007/073777.

* cited by examiner

*Primary Examiner*—Gregory D Thompson
(74) *Attorney, Agent, or Firm*—Locke Lord Bissell & Liddell LLP

(57) ABSTRACT

The present disclosure describes swivel hinge assemblies for use in rotatably mounting two structures together, such that the structures are in fluid communication by way of fluid flow, as well as systems including such hinge assemblies. The swivel hinge assemblies generally comprise a fluid inlet port, a fluid outlet port, shafts surrounding the inlet and outlet ports and allowing for rotation about one or more axes, and attachment means which may be integrally formed with the shafts of the hinge assembly. In use, these assemblies eliminate the use for secondary hinges or secondary mounting hardware in attaching a door and a structure together in order to maintain fluid communication between an electronics rack and a heat exchanger mounted on the door of an electronics rack.

16 Claims, 11 Drawing Sheets

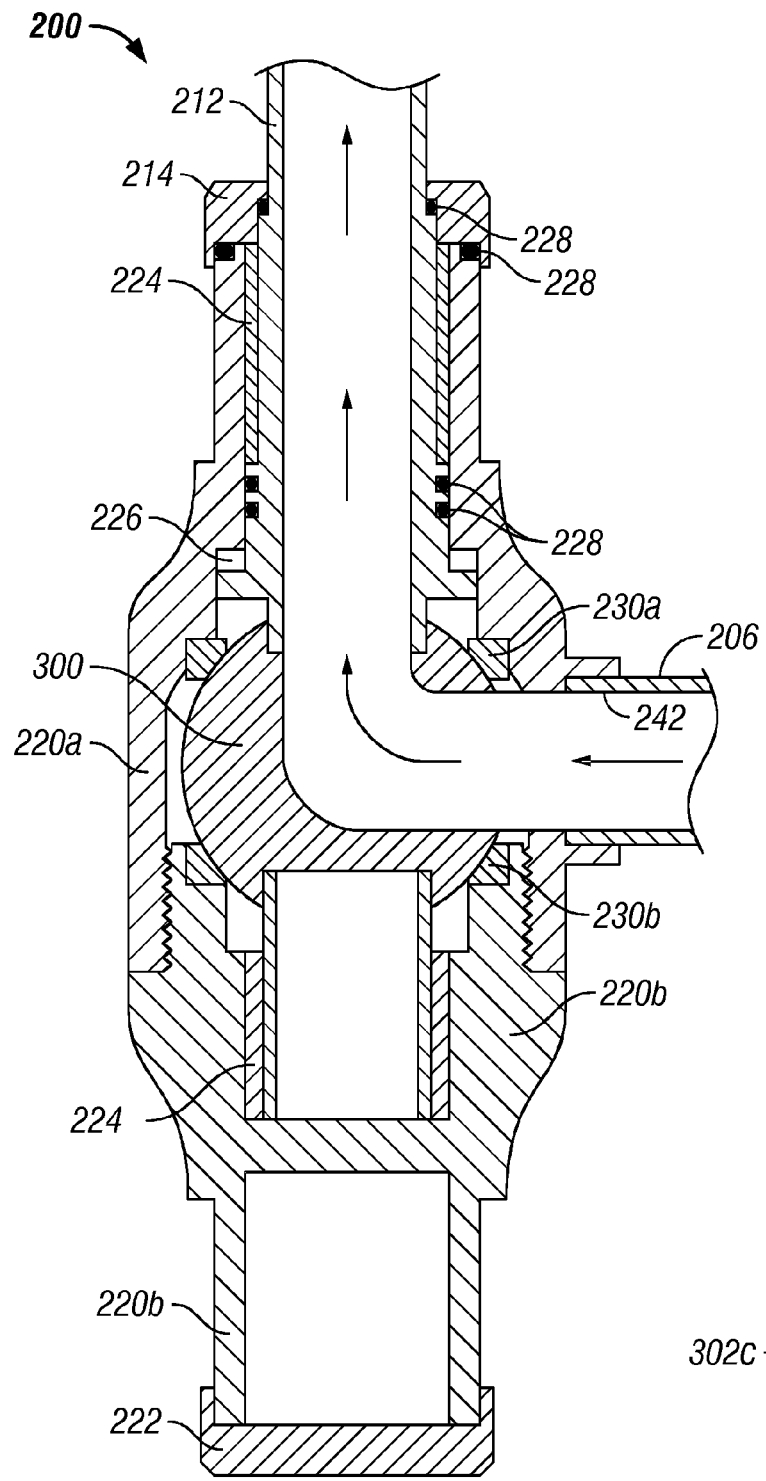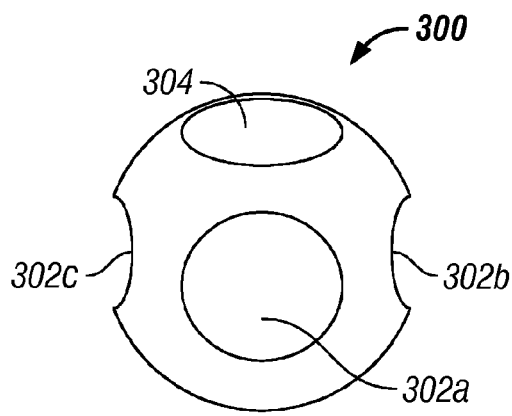
FIG. 8
FIG. 9

INTEGRAL SWIVEL HYDRAULIC CONNECTORS, DOOR HINGES, AND METHODS AND SYSTEMS FOR THEIR USE

CROSS REFERENCE TO RELATED APPLICATIONS

The present application claims benefit and priority to U.S. Provisional Patent Application Ser. No. 60/831,489 filed Jul. 18, 2006, the contents of which are incorporated herein by reference in its entirety.

STATEMENT REGARDING FEDERALLY SPONSORED RESEARCH OR DEVELOPMENT

Not applicable.

REFERENCE TO APPENDIX

Not applicable.

BACKGROUND OF THE INVENTION

1. Field of the Invention

This disclosure relates generally to swivel hinge assemblies, and more particularly, to swivel hinge assemblies having integral mounting openings in the body of the swivel hinge assembly and having an interior fluid flow path, so as to provide rotatable motion via integral bearings capable of providing hingable rotation, and a hinge mounting assembly.

2. Description of the Related Art

The growth of the computer industry over the past few decades has been phenomenal. The integration of these technologies, for example, in data centers and in telecommunications switching, has lead to greater and greater efficiencies as larger numbers of communications are handled by fewer components, which are typically housed in a central control room. In turn, the power densities of computer systems housed in such central rooms have risen to levels that exceed the capacity of traditional approaches to cooling, thereby creating hot spots within the data center that can reduce the availability of business critical systems.

As is readily apparent, if equipment is not effectively cooled, the internal temperature of the electronic components in the equipment substantially increases, thereby leading to significantly reduced system performance and, in some cases, total system failure. Additionally, if a cooling system inefficiently cools the equipment, either the equipment may fail due to increased operating temperature or the costs for cooling the equipment may be unnecessarily high. What is needed, then, are cooling systems having their cooling characteristics closely tailored to the heating characteristics of the equipment to be cooled.

In designing such cooling systems, there is inherently the realization that there is a premium on space in such computer room environments which is matched by this increasing need for cooling capacity. One alternative has been to move the cooling systems into the ceiling such that the cooling coils, fans and a portion of an enclosed room form an enclosed space behind the cooling coils and fans that is then used as a plenum for returning the cooling fluid to the proximal location of the object to be cooled. Alternatively, the cooling system can be moved into the floor such that the cooling coils, fans and a portion of an enclosed room form an enclosed area behind the cooling coils and fans that is then used as a plenum for returning the cooling fluid to the area to be cooled. Cooling coils and fans can be added as necessary to fully enclose the space behind the cooling coils and fans.

Another approach includes the use of rack-mounted cooling systems that are capable of delivering focused, efficient, high-capacity supplemental cooling while simultaneously leaving valuable data center floor space unconsumed. While certain OEM cooling applications would benefit from having rack-mounted cooling systems, such as a cooling coil, mounted on the backside of a hardware rack, traditional mounting methods would subsequently preclude access to the equipment from the backside due to the fixed position of the coil, making any necessary access to the equipment costly both in terms of time and money, as well as resulting in potential down time for the equipment system.

Thus, there is a need in the art for an assembly which allows for the integral, rotatable mounting of a door having a cooling assembly mounted thereon to a face of a hardware rack, while simultaneously allowing for continuous fluid flow within the assembly and fluid communication between the cooling assembly and the equipment within the hardware rack. This application for patent discloses an integral, rotatable swivel hinge assembly.

BRIEF SUMMARY OF THE INVENTION

In a first aspect of the present disclosure, a swivel hinge assembly is described, wherein the swivel hinge assembly comprises a first relatively stationary base member and a second relatively stationary base member; a first swivel member having a channel extending through the body of the swivel member, the swivel member being integral with the first relatively stationary base member; a second swivel member that is integral with the second relatively stationary base member; and a channel extending through both the first swivel member and the second swivel member and providing fluid communication between the first and second swivel members. In accordance with this aspect of the disclosure, the first base member and the first swivel member include a swivel shaft and the second base member and the second swivel member including at least one aperture in which the swivel shaft is journaled for rotation. In further accordance with this aspect of the disclosure, the first swivel member can journal on the first stationary base member, and the second swivel can journal on the second stationary base member, thereby allowing for swivel rotation.

In accordance with a further aspect of the present disclosure, a swivel hinge assembly that is capable of 360° rotation about a central axis is described, wherein the hinge assembly comprises a first leaf member and a second leaf member; a central hinge barrel, or body, located intermediate between the first and second leaf members; a refrigerant return line joined to the hinge barrel; a refrigerant supply line joined to the hinge barrel; and a ball located within the hinge barrel and having two or more orifices contained within the hinge barrel and providing fluid communication between the return line and the supply line. Such a hinge assembly may further comprise a throat portion and a thrust bearing assembly, wherein the thrust bearing is intermediate between the throat portion and the hinge barrel. The refrigerant (coolant) return line and supply line may be joined to the hinge barrel in a substantially perpendicular orientation, or a substantially parallel orientation.

In yet another aspect of the present disclosure, a system for use in cooling heat-generating components such as computer and electronic equipment housed within an electronic rack is described, wherein the system comprises an electronics rack having a frame comprising one or more sides, a top, and a base, and optionally a front and back portion; a closure assembly, such as a door or the like, for the electronics rack that comprises an inside face and an outside face; a heat exchanger; coolant fluid supply pipes capable of conveying a fluid coolant through the heat exchanger and into and out of the electronics rack; and a swivel hinge assembly in accordance with the hinge assemblies described herein, wherein the swivel hinge assembly is located intermediate between the frame and the closure assembly and provides fluid communication between the coolant fluid supply pipes and the heat exchanger.

BRIEF DESCRIPTION OF THE SEVERAL VIEWS OF THE DRAWINGS

The following figures form part of the present specification and are included to further demonstrate certain aspects of the present invention. The invention may be better understood by reference to one or more of these figures in combination with the detailed description of specific embodiments presented herein.

FIG. 8 illustrates a partial cut-away view of the swivel hinge assembly of FIG. 7.

FIG. 9 illustrates an exemplary ball valve for use in accordance with aspects of the present disclosure.

Figure 1:
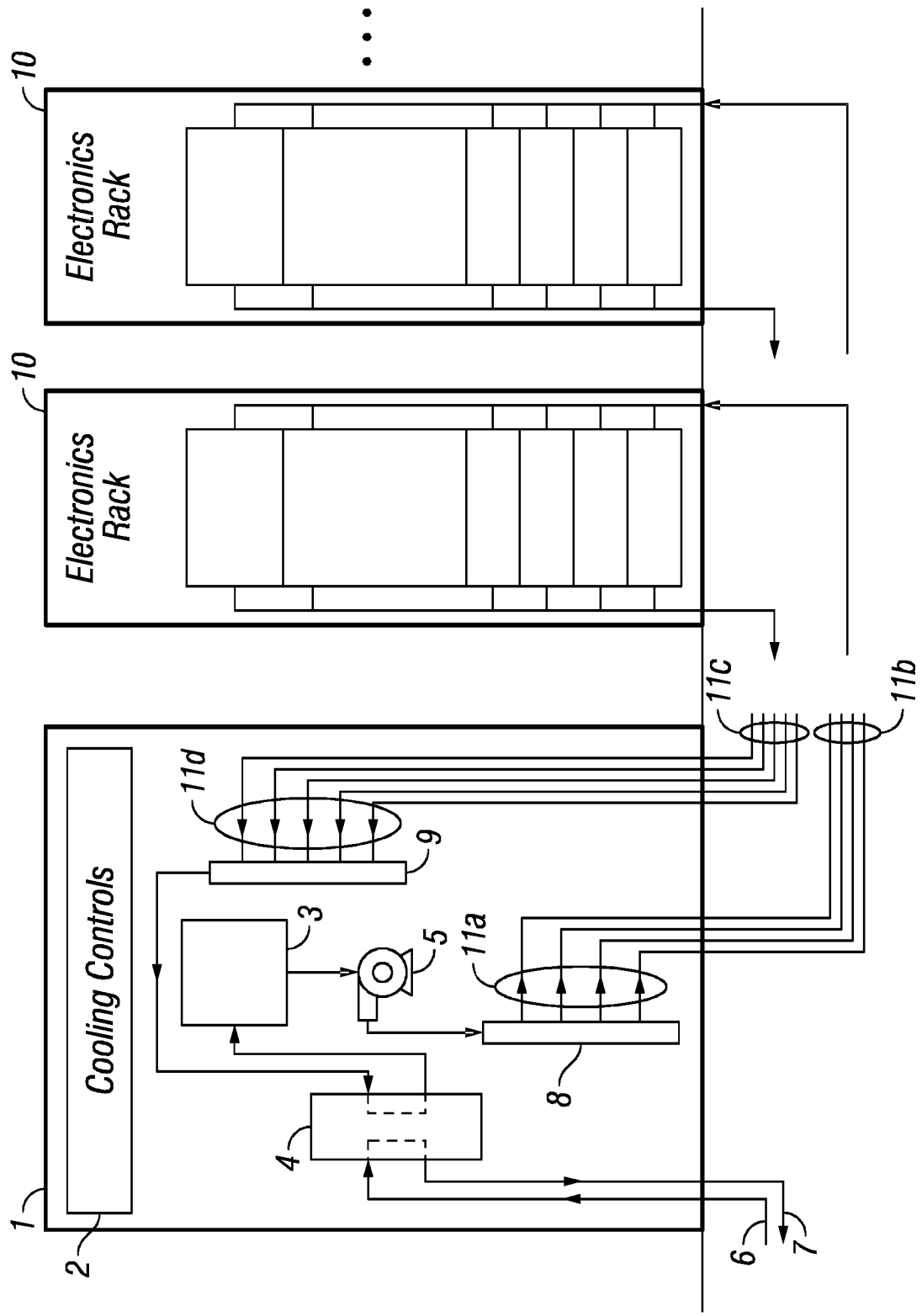
FIG. 1 illustrates a conventional coolant distribution unit for a computer room.

While the inventions disclosed herein are susceptible to various modifications and alternative forms, only a few specific embodiments have been shown by way of example in the drawings and are described in detail below. The figures and detailed descriptions of these specific embodiments are not intended to limit the breadth or scope of the inventive concepts or the appended claims in any manner. Rather, the figures and detailed written descriptions are provided to illustrate the inventive concepts to a person of ordinary skill in the art and to enable such person to make and use the inventive concepts.

DETAILED DESCRIPTION

One or more illustrative embodiments incorporating the invention disclosed herein are presented below. Not all features of an actual implementation are described or shown in this application for the sake of clarity. It is understood that in the development of an actual embodiment incorporating the present invention, numerous implementation-specific decisions must be made to achieve the developer's goals, such as compliance with system-related, business-related, government-related and other constraints, which vary by implementation and from time to time. While a developer's efforts might be complex and time-consuming, such efforts would be, nevertheless, a routine undertaking for those of ordinary skill the art having benefit of this disclosure.

In general terms, Applicants have created a rotatable swivel hinge assembly having both fluid transfer capability as well as hinge mounting capability, allowing the hinge to be mounted to a suitable structure and simultaneously remain capable of conveying fluids in a substantially continuous manner.

It should be noted that in the descriptions of the drawings, the same components will be provided with the same reference numerals and duplicate explanation for the same components is omitted. The ratios of sizes appearing in the various figures are not always coincident with the description. Additionally, this description is intended to be read in connection with the accompanying drawings, which are to be considered part of the entire written description of this invention. In the description, relative terms such as "horizontal," "vertical," "up," "down," "top" and "bottom" as well as derivatives thereof (e.g., "horizontally," "downwardly," "upwardly," etc.) should be construed to refer to the orientation as then described or as shown in the drawing figure under discussion. These relative terms are for convenience of description and normally are not intended to require a particular orientation. Terms including "inwardly" versus "outwardly," "longitudinal" versus "lateral" and the like are to be interpreted relative to one another or relative to an axis of elongation, or an axis or center of rotation, as appropriate. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise. The term "operatively connected" refers to such an attachment, coupling or connection that allows the pertinent structures to operate as intended by virtue of that relationship.

As used herein "electronics subsystem" is meant to refer to any housing, frame, rack, compartment, etc., containing one or more heat generating components of a computer system or other electronics system requiring cooling. The term "electronics rack" includes any frame or rack having a heat generating component of a computer system or electronics system; and may be, for example, a stand alone computer processor having high, mid or low end processing capability. In one non-limiting embodiment, an electronics rack may comprise multiple electronics drawers, each having one or more heat generating components requiring cooling. Further, it should be noted that while this disclosure describes generally the application of hinge assemblies capable of transferring fluid between a door and an electronics rack assembly, such descriptions are not meant to be limiting in any way. More specifically, while the present disclosure is illustrative for embodiments and applications associated with electronics cooling, one of skill in the art may apply this to other applications, such as to self-contained coolers, wherein inclusion of the hinge assemblies described herein would allow ready access to the components within the cooler for repairs by simply moving the coil (or a group of components) by rotating the assembly out of the way.

Turning now to the Figures, reference is now made to the drawings, wherein the same reference numbers used throughout different figures designate the same or similar components. FIG. 1 illustrates a general conventional-type coolant distribution system for a computer room, as relates generally to the present inventions. The cooling unit 1 typically comprises one or more cooling units, designated as cooling controls 2, a reservoir/expansion tank 3, a heat exchanger 4, a pump 5 (often accompanied by a redundant second pump, not shown), coolant (e.g., on-site or facility service water or coolant) inlet 6 and outlet 7 supply pipes, a supply manifold 8 directing coolant to the electronics racks 10 via couplings 11a and lines 11b, and a return manifold 9 directing coolant from the electronics racks 10, via lines 11c and couplings 11d. In the exemplary operation as illustrated, the heat exchanger 4 acts as a condenser, and coolant fluid flows from the electronics racks 10 via lines 11c to return manifold 9, then through heat exchanger 4 and into reservoir 3. Thereafter, the coolant fluid flows into pump 5, wherein it is pushed into the supply manifold 8 and is returned to electronics racks 10 via return lines 11b.

Figure 2A:
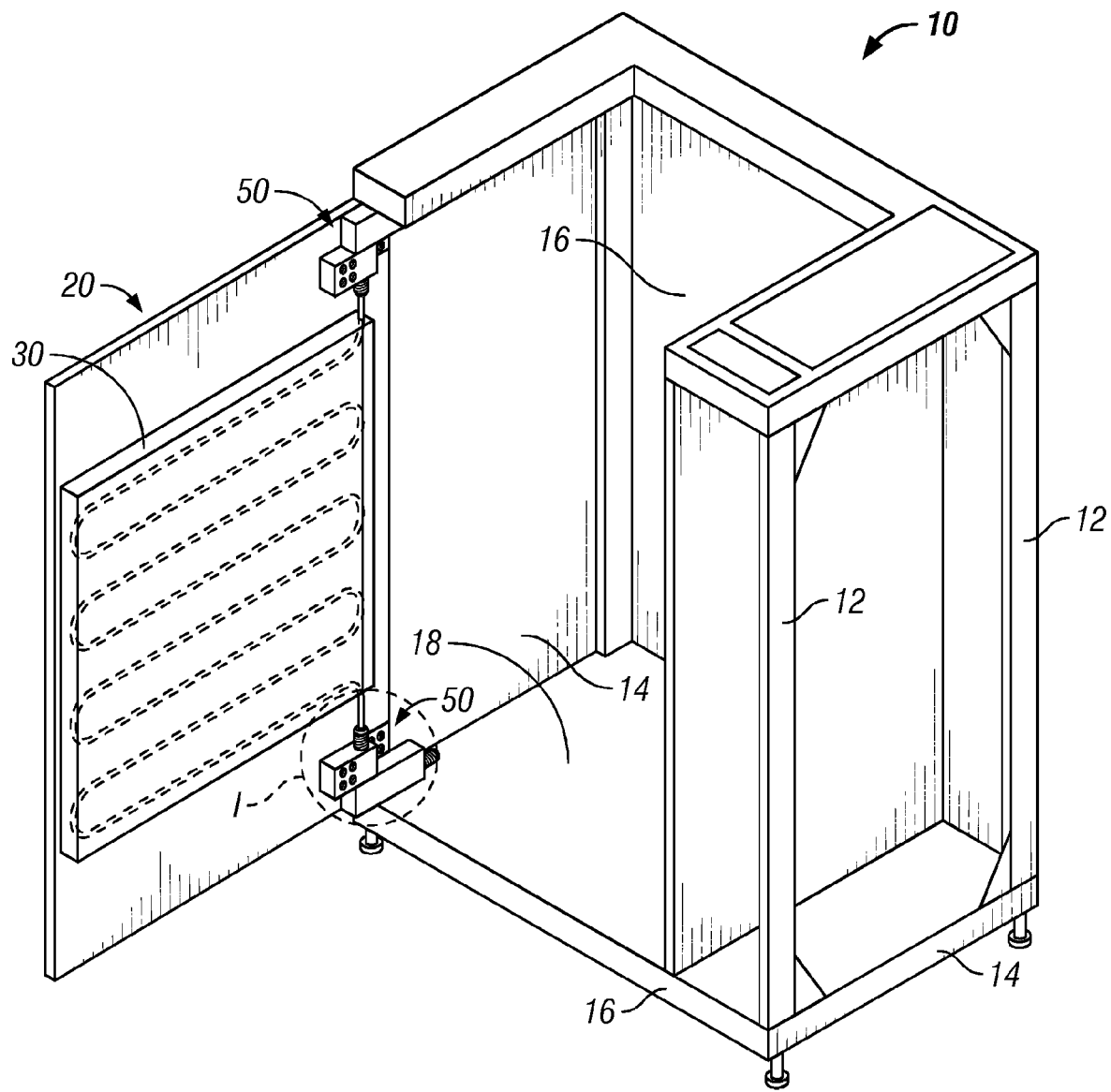
FIG. 2A illustrates an isometric view of an assembly in accordance with aspects of the present invention.

FIG. 2A illustrates a perspective view of an assembly in accordance with aspects of the present invention, in association with a computer hardware or electronics rack. Specifically, a hardware electronics frame 10 having stiles 12, side rails 14, front and back rails 16, and base 18 is illustrated. The plurality of stiles 12 connect to the corners of rails 14 and 16 and base 18 to form the frame, using fasteners, welding, or other mechanical connection. The cabinet can also contain a plurality of bus bars for connection to a load, such as a computer network (not shown). Hardware frame 10 can be made of any appropriate material, such as galvanized metal, and can be attached together by an appropriate fastener, such as pop rivets, screws, welding, or other known fasteners, attachment methods, and combinations thereof.

FIG. 2A also illustrates that frame 10 comprises a hingably mounted door 20, or similar closure assembly, via a swivel hinge assembly 50 in accordance with aspects of the present invention, the door 20 having a cooling assembly 30 attached to the inside face. Cooling assembly 30 typically comprises a cooling coil or other similar cooling assembly capable of having a cooling fluid (liquid, gas, or both) flowing therethrough. While cooling assembly 30 is shown attached to the inside face of door 20, it can also be attached to the outside face of the door, in accordance with aspects of the present disclosure. In further aspects of the present disclosure, cooling assembly 30 can also be constructed in such a manner that the assembly itself acts as the door, and is hingably attached to frame 10 (or a similar structure) via swivel hinge assembly 50. In additional aspects of the present disclosure, door 20 may be sized to be smaller than an opening on frame 10, making it a hingably-attached structure. Similarly, it is envisioned that door 20 may be substantially a framed structure having one or more components attached thereto, but wherein a majority of the space on door 20 is open and unblocked by any structures.

Figure 2B:
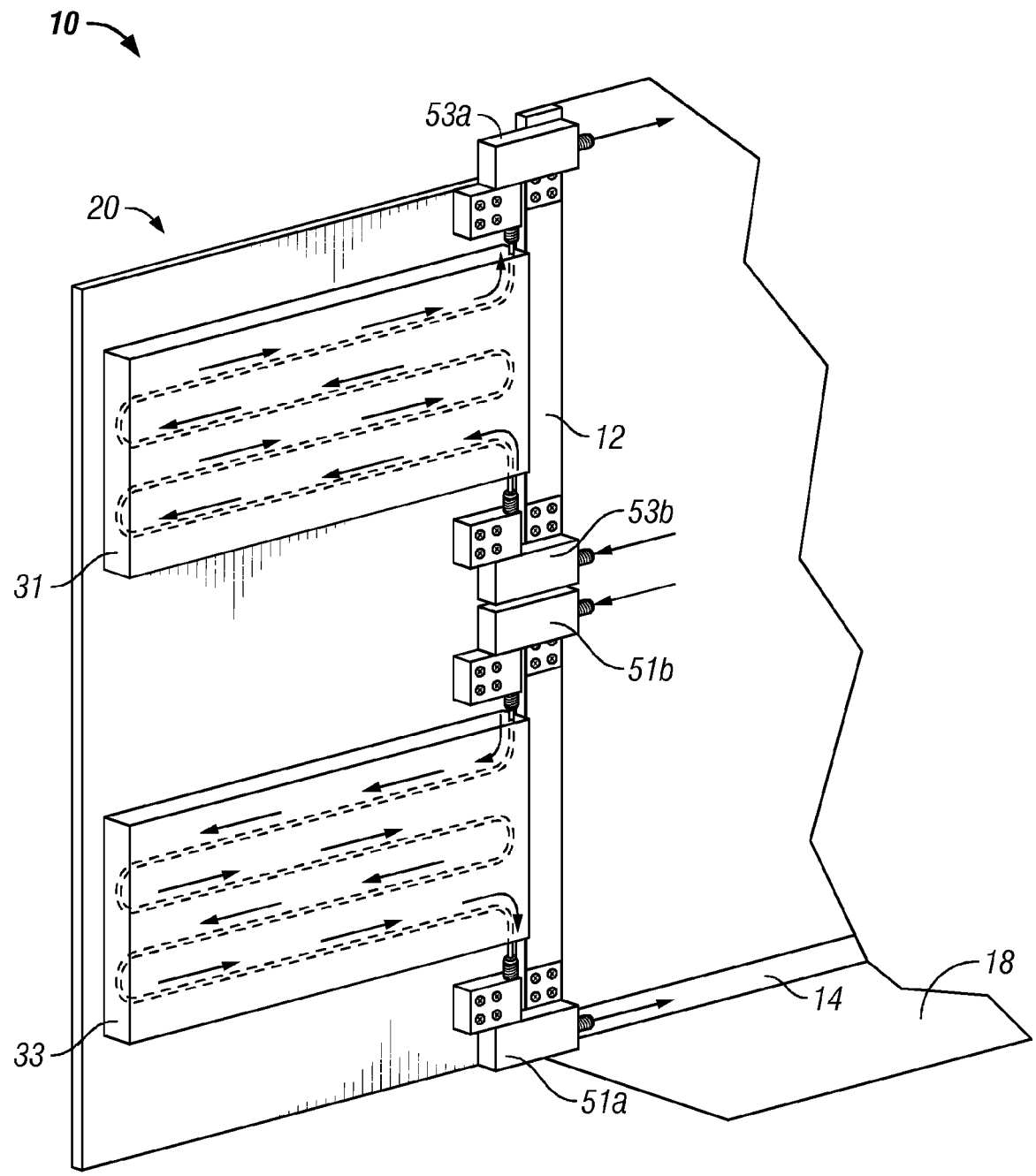
FIG. 2B illustrates an isometric view of a further assembly in accordance with aspects of the present invention, illustrating a door assembly having separate circulation loops.

FIG. 2B illustrates a further assembly in accordance with aspects of the present disclosure, illustrating that more than one set of hinge assemblies per door panel can be used, and the hinge assemblies can be used and/or associated with multiple cooling assemblies. As such, door 20 to electronics cabinet frame 10 may have a plurality (e.g., two, as shown in the figure) of cooling assemblies, 31 and 33, which may be mounted in an appropriate manner to an inside face of door 20. In accordance with this aspect of the present disclosure, cooling assemblies 31 and 33 may act as evaporators, and swivel hinge assemblies serve to maintain coolant or refrigerant fluid communication between the cooling assemblies 31 and 33 and a condenser system such as cooling unit 1 that is located remote from the cabinet frame 10. In this case, during the course of operation, the coolant fluid would flow around the cooling assemblies 31 and 33 housed within the cabinet door, picking up heat from the air that is flowing out of the cabinet 10 that is housing the electronic systems and devices. Swivel hinge assemblies 51b and 53b may be in fluid communication with each other, allowing fluid to flow from cooling assembly 33 to cooling assembly 31, or vice-versa, where after the coolant may then be transported out of the cooling assemblies, and away from the cabinet frame 10, to a remote condenser system located in a separate cabinet, by way of swivel hinge assemblies 51a and/or 53a. In this way, the heat generated by the electronics systems housed within the electronics cabinets may be rapidly, safely, and efficiently rejected. Optionally, and equally acceptable, the heat exchangers may be connected in parallel, rather than in series, as desired thermal performance may dictate.

Figure 2C:
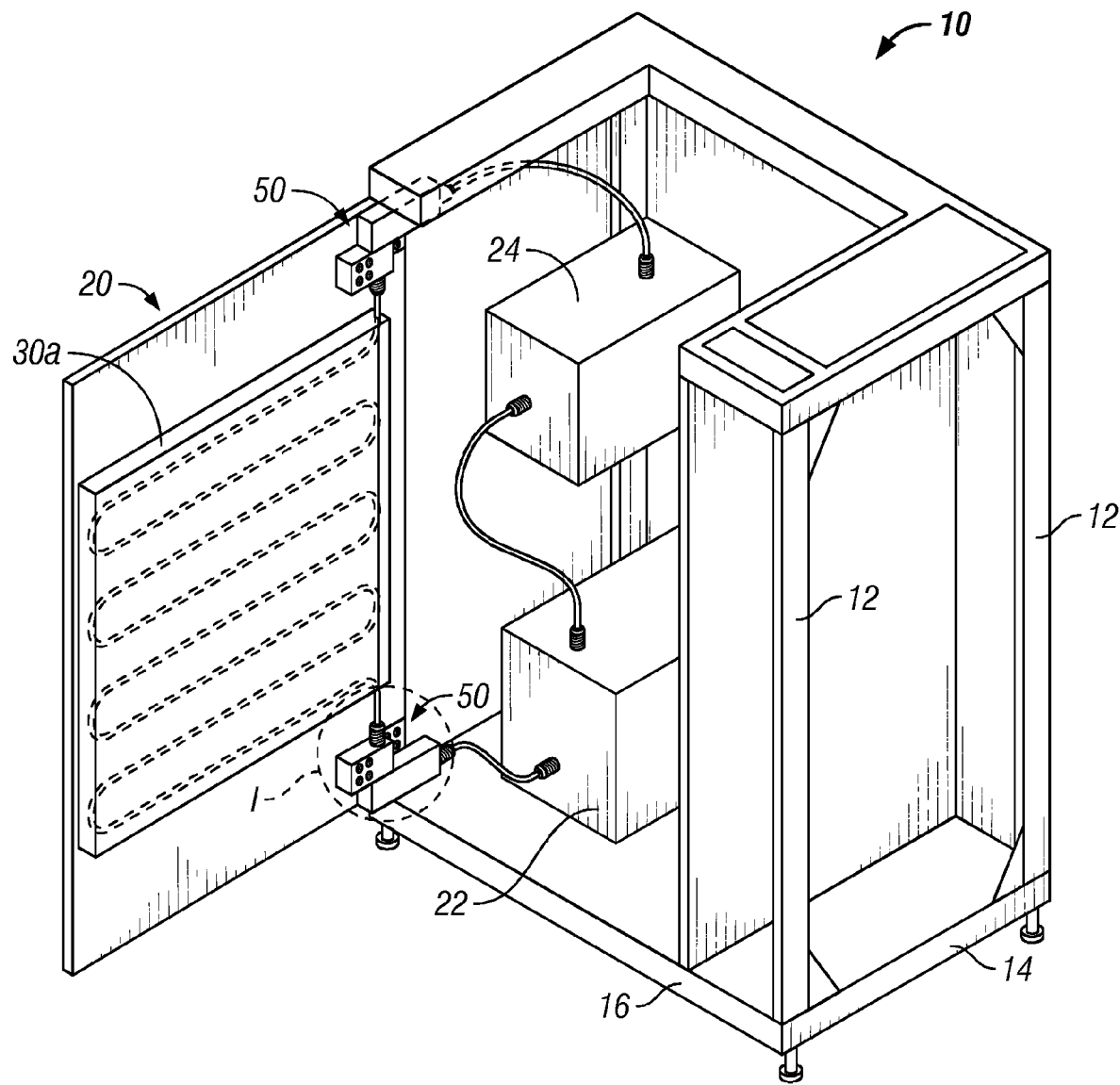
FIG. 2C illustrates an alternative hinge assembly system in accordance with aspects of the present disclosure, illustrating the inclusion of a coolant distribution unit within the enclosure.
Figure 2D:
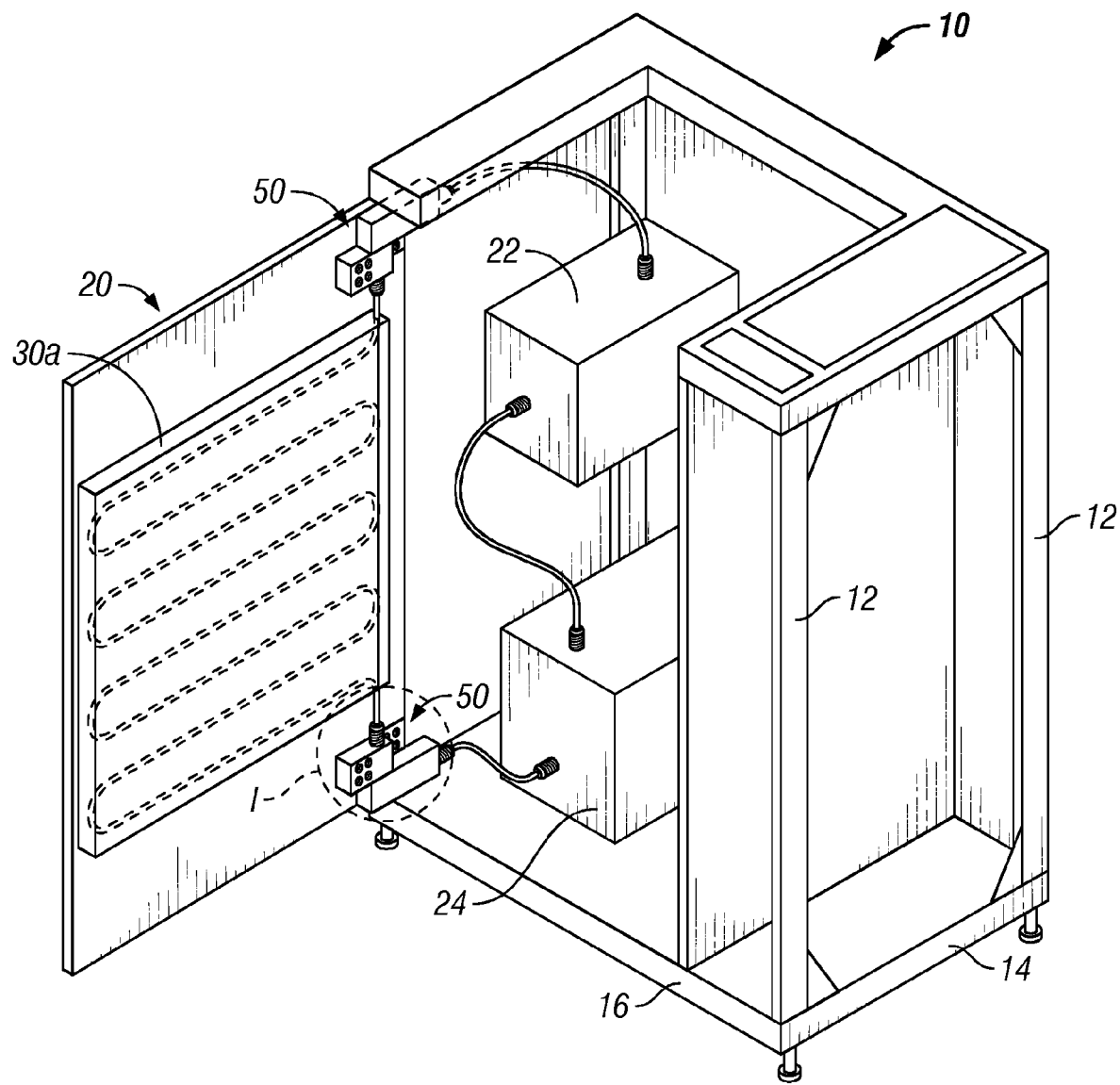
FIG. 2D illustrates a further alternative hinge assembly system in accordance with aspects of the present disclosure, illustrating an alternative arrangement of a coolant distribution unit within the enclosure.

As an alternate assembly and use, and with continued reference to FIG. 2B, door 20 may have two (or more) cooling assemblies, 31 and 33, mounted to its inside face, and four swivel hinges, two associated with cooling assembly 31 and two associated with lower cooling assembly 33. Upper cooling assembly 31 has a swivel hinge assembly 53 associated with it, such that there is a first swivel hinge assembly 53a near the top of the cooling assembly, and a second swivel hinge assembly 53b near the bottom of the cooling assembly, allowing for coolant flow out to systems within cabinet frame 10, and coolant flow return back into assembly 31. Similarly, lower cooling assembly 33 is illustrated with a swivel hinge assembly 51 associated with it, such that there is a first swivel hinge assembly 51b near the top of the cooling assembly, and a second swivel hinge assembly 51a near the bottom of the cooling assembly. In accordance with this application, the cooling assemblies 31 and 33 may be used as condensers, acting to cool fluid (refrigerant) that is picking up heat from systems housed within electronics cabinet frame 10, similar to the aspects illustrated in FIGS. 2C and 2D. As illustrated therein, a swivel hinge assembly 50 (or 200, not shown) in accordance with aspects of the present disclosure, may be mounted on an enclosure such as electronics cabinet frame 10, wherein the enclosure also houses the coolant distribution unit comprising circulating unit 22 and heat source 24 within the same structure and in communication with each other, while the door comprises (at least in part) a coil condenser or heat rejection unit 30a. The coolant distribution unit may be any number of air-cooled condenser/cooler systems wherein both the electronics and the cooling systems themselves may be mounted within the same structure. In accordance with these aspects of the present disclosure, and as illustrated in FIG. 2D, the positions of the heat source 24 and the circulator 22 within the cabinet 10 may be switched or varied, as appropriate and as may be determined by the geometry and/or contents of the enclosure itself.

Similar to the properties discussed above, the swivel hinges of swivel hinge assembly 53a allow for liquid coolant flow out from the systems housed within electronics cabinet frame 10, where the heat is rejected back into the atmosphere surrounding the electronics frame by way of cooling assembly 31. The coolant, having released a substantial portion of the heat energy it contained, may then be cycled back to and around the systems housed within the frame 10 via a coolant flow return through the second swivel hinge, 53b. A similar application can occur through lower assembly 33, wherein 33 similarly acts as a condenser, and cycles the coolant out of and back into the lower portions of frame 10 via swivel hinges 51a and 51b. In a further aspect of the present disclosure, related to the modified assembly of FIG. 2B, two (or more) heat exchangers could be mounted on top of each other, face to face (not shown), allowing for the two cooling assemblies to service a plurality of different cooling loops. This may be useful, for example, when two different coolants are being used within the first and second cooling assemblies. Similarly, a heat exchanger may be supplied with coolant from one swivel hinge and may exhaust to two or more swivel hinges, or may be supplied from two or more swivel hinges and exhaust through a single swivel hinge.

Figure 3:
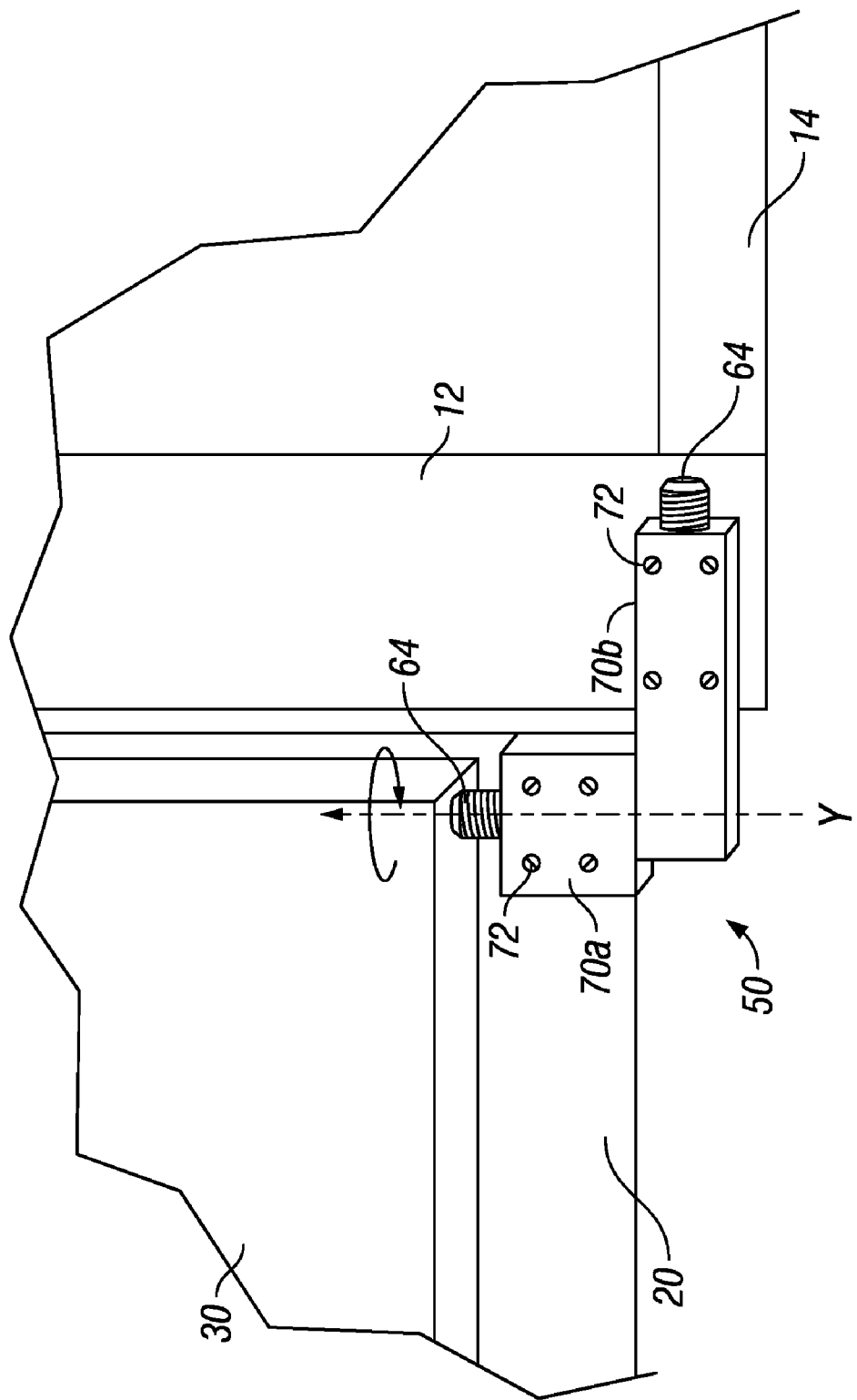
FIG. 3 illustrates a detail of section I of the assembly of FIG. 2A.

FIG. 3 illustrates a detail of section I of FIG. 2A. As illustrated therein, swivel hinge assembly 50 is constructed so as to be hingably mounted onto a stile 12 of hardware frame 10 and door 20 by way of base members 70a and 70b, which in turn provide a means to attach assembly 50 to frame 10 and door 20 using fasteners, such as screws 72. In accordance with aspects of this disclosure, assembly 50 may also be attached to frame 10 (or another, suitable structure) by a mechanical attachment method, such as by welding the assembly 50 into place. As illustrated therein, the swivel hinge assembly 50 allows for door 20 to be rotatably and hingably attached to stile 12 of frame 10 in a manner such that door 20 and frame 10 can rotate relative to each other as appropriate, while maintaining fluid communication between cooling assembly 30 and the components within frame 10. For example, in accordance with aspects of the present disclosure, the proximal ends 64 of the swivel assemblies can be threadably attached to the cooling assembly 30 and fluid conveyance means within the frame 10, respectively. In the event that access to components housed within frame 10 need to be accessed, door 20 can be opened in a conventional manner, wherein swivel assembly 50 provides both hingable rotation of door 20 around the Y-axis illustrated, and substantially continuous fluid communication between cooling assembly 30 and the components within frame 10.

Additionally, and in accordance with the present disclosure, the frame, stiles and swivel hinge assembly 50 can be designed such that attaching the hinge assembly to the stile 12 and the door 20, and using one or more O-rings in between the components, results in a completed fluid flow path. For example, stile 12 of frame 10 can be substantially hollow, having a secondary fluid connection port, which may be a welded joint or a threaded connection that connects to the cooling assembly 30. This may be beneficial to the door from the design aspect, wherein the door is the evaporator itself. Additionally, this may further assist in coolant distribution throughout the frame itself, for example in the instances where multiple hinge assemblies may be required between the frame and the door, as discussed above in reference to FIG. 2B.

Figure 4:
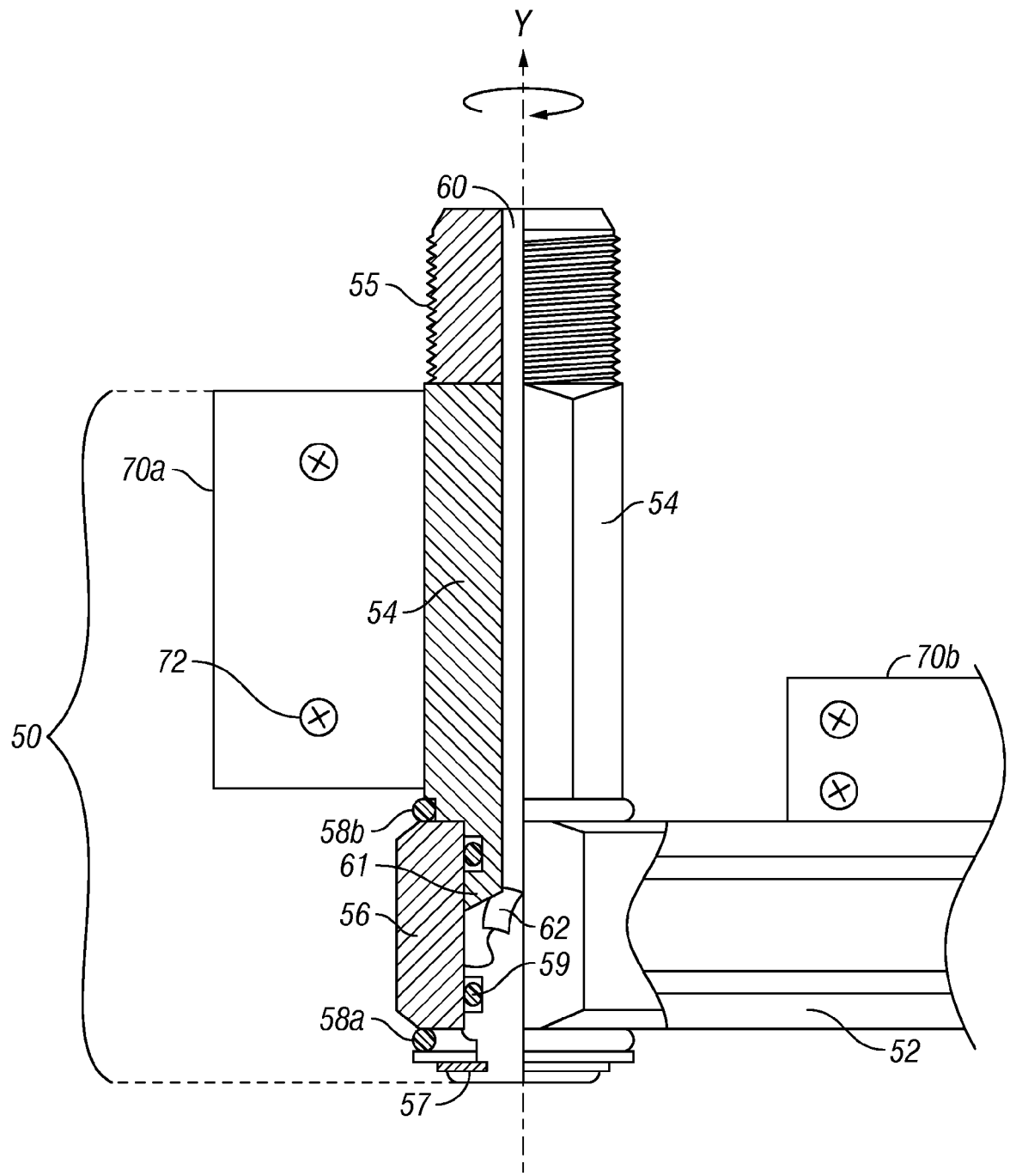
FIG. 4 illustrates a swivel hinge assembly in accordance with aspects of the present invention.

FIG. 4 illustrates a partial detail view of swivel hinge assembly 50 from FIG. 3, rotatable around axis "Y", comprising a first swivel member, or port, 52, having integrally formed and relatively stationary base member, or attachment leaf, 70b attached to a face of swivel member 52. As illustrated in the figure, the base member 70b of assembly 50 can be connected to the assembly 50 by any appropriate attachment method or means, such as by welding, brazing, or similar known attachment methods. Hinge assembly 50 also comprises a second swivel member 54, also having an integrally formed and relatively stationary base member, or attachment leaf, 70a. Both first and second swivel members 52 and 54 may comprise a fluid channel 60 extending substantially within them, and one or more fluid flow bearings 62, rotatably oriented such that substantially continuous fluid communication can be maintained between the first and second swivel members. Threadable ends 55 at the proximal end of each of the swivel members allow for sealable attachment to the assembly undergoing rotation, such as cooling assembly 30 (not shown). Optionally, and equally acceptable, threadable ends 55 may be replaced by, or subsidized with, tubes of a suitable composition (e.g., steel, aluminum, bronze, or copper) so that they can be welded, soldered, or brazed into position as appropriate. Ends 55 may also be constructed or adapted in an appropriate manner so as to allow for a connector, such as a quick-release connector suitable for maintaining refrigerant fluid flow, to be engaged or brought into communication with swivel hinge 50. In accordance with aspects of the present disclosure, the base members (or attachment leafs) 70a and 70b can be attached to first and second external objects, such as door 20 and frame stile 12 respectively (see FIG. 2A), using any appropriate fastening means, including screws 72 or other appropriate fasteners known to those of skill in the art.

FIG. 4 also illustrates that swivel assembly 50 comprises O-rings 58a and 58b oriented substantially perpendicular to and circumscribing the channel 60 in second swivel member 54, and oriented substantially parallel to the internal channel (not shown) in first swivel member 52. Optionally, the assemblies of the present invention can comprise one or more lower O-rings 59, which may, but need not, be coupled to shaft 61, and which can provide an additional internal compression seal between first swivel member 52 and second swivel member 54. As further illustrated in FIG. 4, the retaining ring members 56 and 57 exhibit an internal cylindrical peripheral surface pressure which traps O-rings 58a and 58b in position, forming a fluid seal when the internal channel in the first swivel member 52 is positioned adjacent to the channel 60 of second swivel member 54. When so-positioned, the housings of swivel members 52 and 54 can rotate relative to flow bearing 62 around and central to the Y-axis central to internal channel 60 and shaft 61, but are not movable axially relative thereto. Such rotations can be in the range from about 0° to about 360°, as appropriate, but can also include rotations that are continuous (e.g., not limited), as well as preset rotations between any two rotations between 0° and 360°, such as from about 10° to about 120°. Such continuous rotation features can be manifested in, for example, a rotating panel in place of a door member.

The body of swivel hinge assembly 50, comprising swivel members 52 and 54 and base members 70a and 70b, can be made of any appropriate material, as necessary, including but not limited to carbon steel, stainless steel, steel alloys, aluminum, brass, copper, copper-alloys (e.g., bronze, such as aluminum bronze, silicon bronze, and leaded bronze, as well as the traditional copper-zinc alloy-type bronzes), nickel-containing metals, magnesium and its alloys, for nickel and its alloys, ferrous metals, non-ferrous metals, fluid- and thermal-resistant polymers, as well as combinations thereof, any of which can be optionally coated or plated as appropriate, e.g., with a nickel or chromate plating. Additionally, in accordance with aspects of the present disclosure, the body and the swivel member can each be integrally formed of one piece of material. Threadable ends 55 are typically of conventional construction, and mode of operation.

In further accordance with the present disclosure, hinge assembly 50 may further comprise one or more load bearing elements (not shown), such as bearings or the like. Such load bearing elements may be especially preferred to be included when the hinge assemblies are acting to not only provide fluid communication between a cooling assembly and the components within a cabinet, but also when such hinge assemblies 50 simultaneously act as the hinges themselves, providing hingable attachment for the door to the frame. In such instances, load bearing elements have the capacity for increasing the load and load-bearing applications of the swivel hinge assemblies 50. These load bearing elements can be included so as to absorb the moment load and thereby take or remove the weight/compression load of the door from the seal surfaces more fully. Load bearing elements may also be required when the hinges contain fluid at high pressure and/or temperature, as the hydraulic/pneumatic forces are often increased in these situations. The absence of such load bearing elements could cause the hinge components to separate, and/or could increase the wear on the rotatably contacting surfaces, resulting in shortened product life.

In further accordance with aspects of the present disclosure, base members 70a and 70b as illustrated generally in FIG. 3 can be integrally formed with the swivel members 52 and 54 of the hinge assembly 50. Accordingly, both the swivel member and base members can be manufactured from the same piece of bar-stock, thereby minimizing costs associated with manufacture. Optionally, and equally acceptably, the base members 70a and 70b can be fastened to one or more appropriate exterior faces of the body of swivel members 52 and 54, using any appropriate fastening method, including welding or casting.

In reference to the hinge assemblies 50 illustrated herein, in accordance with aspects of the present disclosure, the inlet and/or outlet ports, and associated internal fluid flow channel 60, need not be uniform in size. For example, the outlet port of assembly 50 may necessarily be larger in order to efficiently accommodate the increased volume of fluid flow of a coolant as it returns from a pass through the system, whereupon it has increased in volume due to temperature dependent density and/or partial or complete phase change from liquid to vapor.

Figure 5:
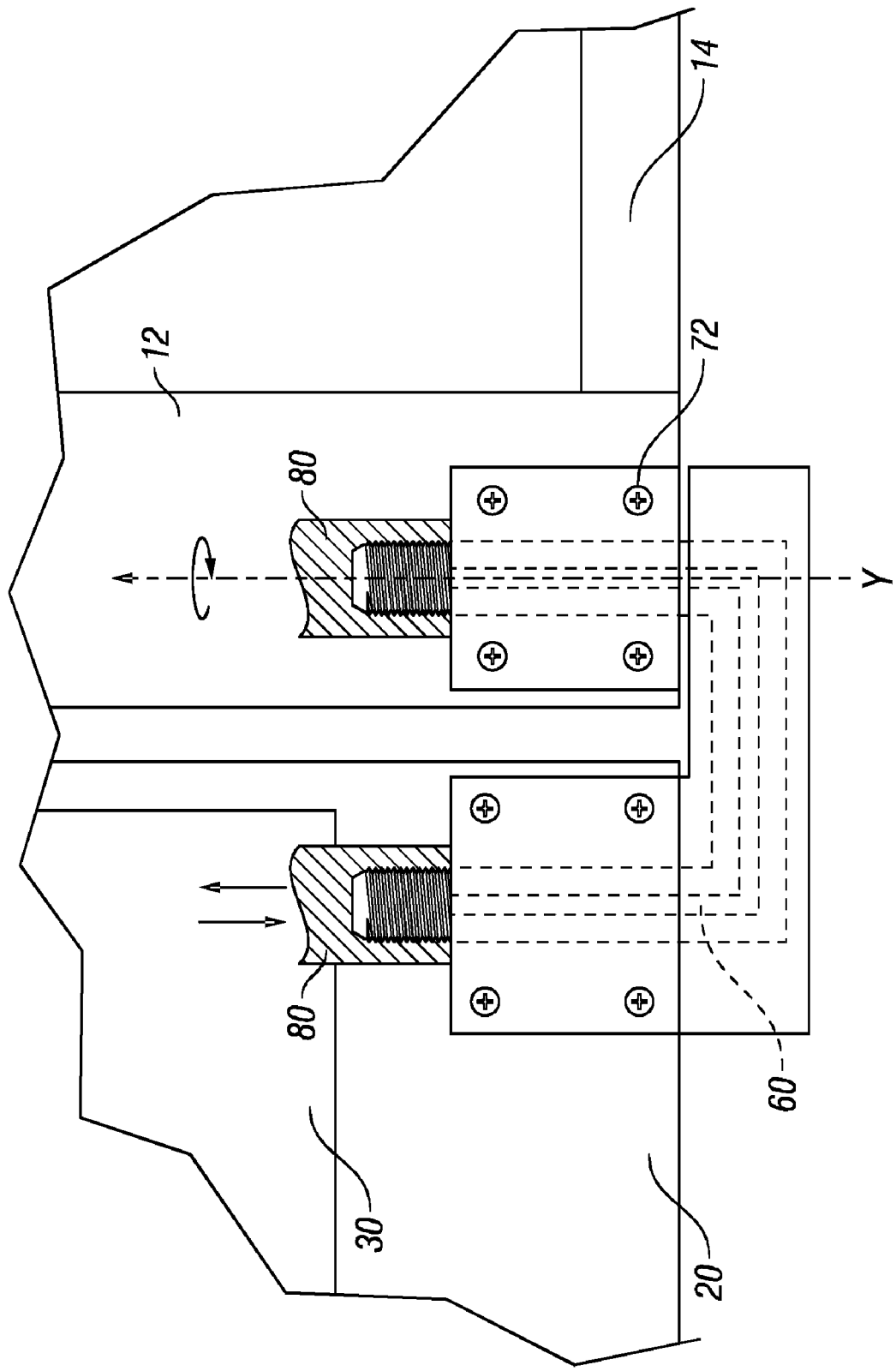
FIG. 5 illustrates an alternative embodiment of the present invention, showing a 180° swivel hinge assembly.

Turning now to FIG. 5, an optional design for the swivel hinge assembly 50 in accordance with the present disclosure is illustrated, wherein the swivel hinge is designed for a substantially 180° flow reversal in the fluid flow path through internal channel 60 running through substantially the entire internal length of assembly 50. According to this embodiment, assembly 50 is oriented such that first and second shafts are oriented substantially parallel to each other when the assembly is attached to a structure, such as frame 10, as shown. First and second swivel members 52 and 54 can be attached to cooling assembly 30 and an appropriate frame or cabinet cooling system, respectively, via connectors 80 threadably attached to the threadable ends 55 of the swivel members. Additionally, hinge assemblies 50 can also be in any number of orientations as appropriate, wherein the first swivel member 52 and the second swivel member 54 are oriented from about 0° to about 180° relative to each other, and any appropriate orientation (e.g. 135°) intermediate between these two orientations.

Figure 6:
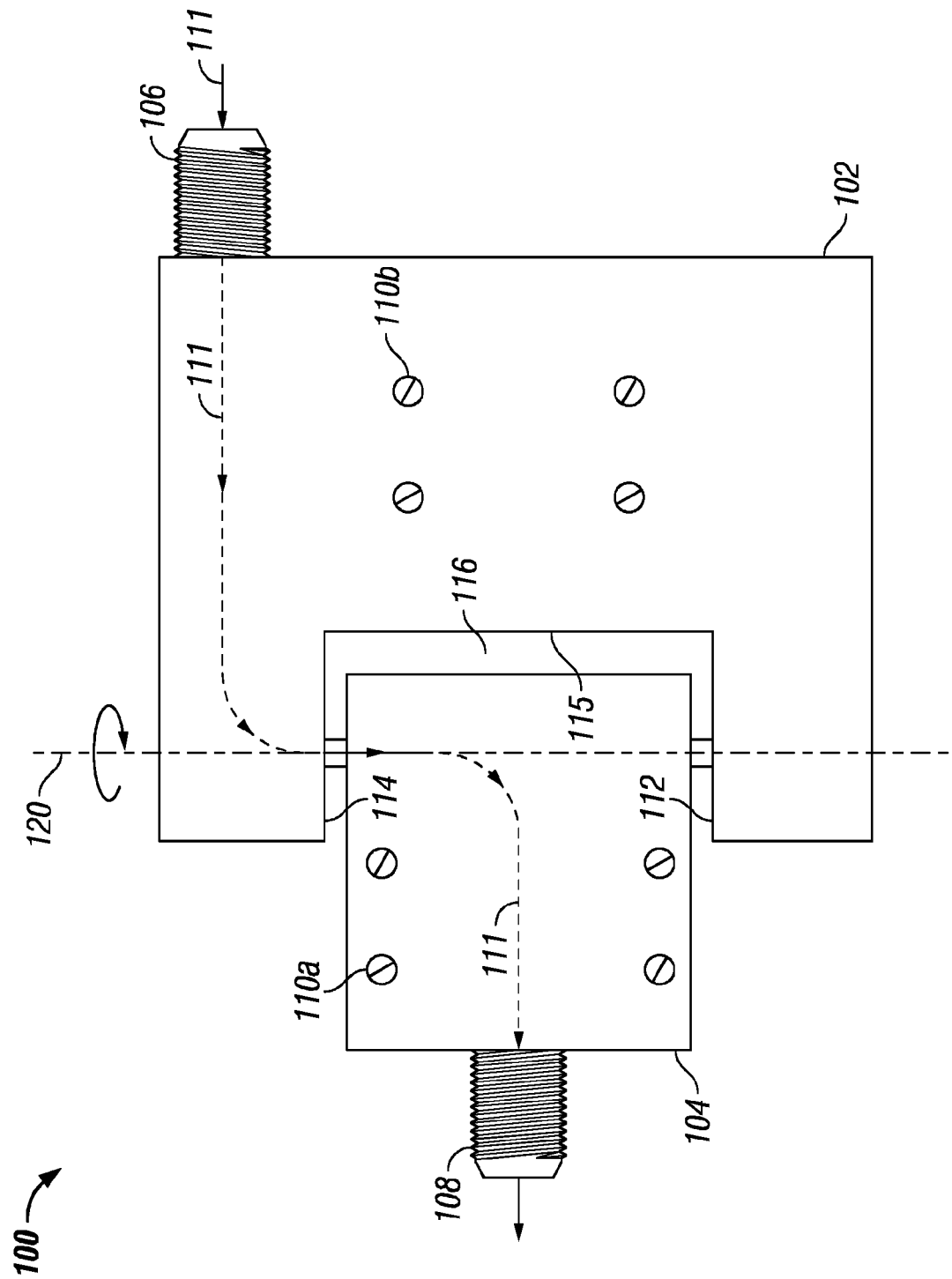
FIG. 6 illustrates a swivel hinge assembly in accordance with alternative embodiments of the present invention.

FIG. 6 illustrates a further swivel hinge assembly in accordance with aspects of the present disclosure. As illustrated therein, swivel hinge assembly 100 comprises a first, shaped main body portion 102, and a second, swivel portion 104. Main body portion 102 comprises at least one threadable inlet, 106, as well as arms 112 and 114 which together with interior edge 115 of body portion 102 form a channel 116. At least a portion of swivel portion 104 may be contained within channel 116 of main body portion 102, such that 102 and 104 interact to form a rotatable axis 120 about which assembly 100 swivels. Body portions 102 and 104 may be attached to a suitable frame and door assembly, as described herein, using an appropriate attachment method, such as by the use of screw members 110a and 110b. In typical operation, fluid flow is in the direction of arrow 111 (although fluid flow could equally be in the opposite direction), in through threadable inlet 106 which can be attached to a fluid flow line (not shown), through both portions 102 and 104, and out of swivel portion 104 via threadable outlet 108 and into a fluid cooling assembly (not shown).

Similarly, while not illustrated, it is envisioned that the swivel hinge assembly 100 of FIG. 6 can be designed such that it comprises two inlets and two outlets on a single, swivel action assembly. In this manner, the swivel hinge assembly could comprise two separate, independent flow paths (inlets/outlets). Alternatively, the two independent flow paths could be two connected flow paths that would allow for a higher rate of flow for a given thickness of swivel hinge assembly, as compared to the swivel hinge assemblies having a single flow path as described in accordance with separate embodiments of the present disclosure. In this last embodiment, there may be two inlets and one outlet, or one inlet and two outlets, or two inlets and two outlets, without limitation. In general, in accordance with this embodiment, the number of inlets may generally be different than the number of outlets, so as to simplify the plumbing of the overall system, and/or allow for distribution of refrigerant to/from multiple locations downstream/upstream of the hinge.

Figure 7:
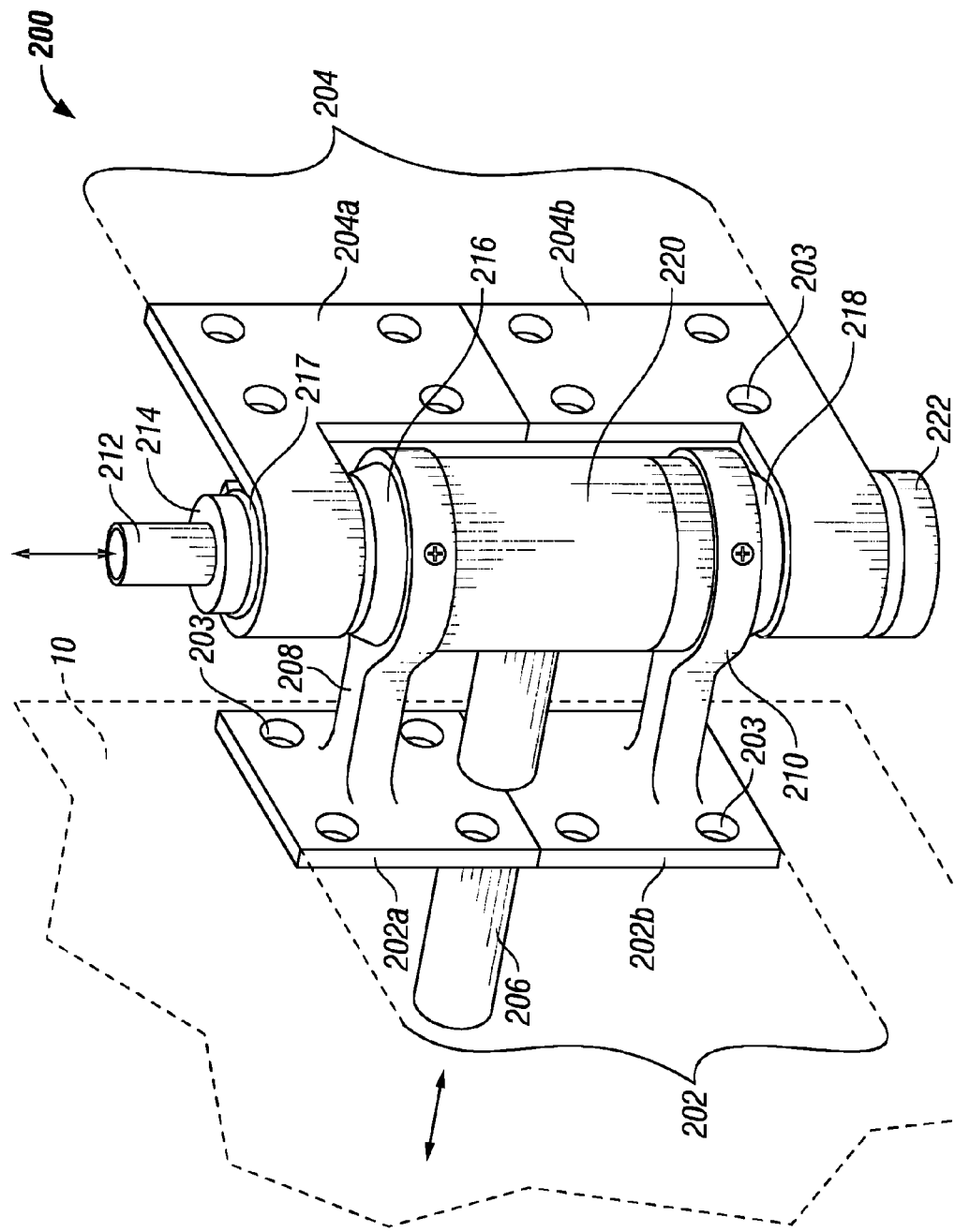
FIG. 7 illustrates a swivel hinge assembly in accordance with embodiments of the present disclosure.

FIG. 7 illustrates a further embodiment in accordance with the swivel hinges of the present disclosure, a multi-position swivel hinge assembly 200 is capable of fluid communication between the electronics rack and coil condensers, heat rejection units, or the like associated with the rack door, and wherein the body acts as the swivel pin of the hinge assembly, concurrent with or, optionally, independent from the hinge leaves. The multi-position swivel hinge assembly 200 comprising a first leaf assembly 202 and a second leaf assembly 204 (illustrated as frame leaf assembly (202) and door leaf assembly (204)), a central barrel section 220 that acts as the hinge pin, a refrigerant return line 206, and a refrigerant supply line 212. For purposes of illustration only, the first and second leaf assemblies have been shown to be the frame and door leaf assemblies, respectively; however, as will be appreciated by those of skill in the art, the first and second leaf assemblies are interchangeable. Depending upon which leaf attaches to the door and which leaf attaches to the frame, the location of thrust bearings within the hinge assembly 200 may be adjusted, so as to be able to handle the weight of the door, as appropriate. Further, and as will be discussed in more detail below, central barrel section 220 preferably contains a ball (not shown) or cylinder, or an equivalent assembly, which serves to provide rotational fluid communication between supply line 212 and return line 206. In accordance with this aspect of the disclosure, it is important to note that while the fluid communication means is illustrated herein as a ball 300, in other options the cylindrical fluid communication line and ball 300 could be optionally and equally acceptably be a one-piece cylindrical assembly. In accordance with this optional embodiment, this one-piece cylinder can have a central section (300', not shown) having a size approximately equal to the size of the ball illustrated in FIG. 8 herein, and having a tapered top and bottom on which the seat/seals 230a and 230b may sit.

With continued reference to FIG. 7, the return line 206 and supply line 212 may be oriented substantially perpendicular to each other, as illustrated, although other orientations are also suitable for use with the multi-position swivel hinge assembly 200. Such optional orientations include, but are not limited to, orientations wherein return line 206 and supply line 212 are substantially axially aligned, being joined by an appropriately-formed ball within central barrel section 220. As illustrated in FIG. 7, the supply line 212 and the return line 206 may be from a cooling system, such as from the XDP system (Liebert Corporation), and to a cooling system, respectively, such that fluid flows into the swivel hinge assembly and is redirected about 90°, via swivel ball 300 (see, FIG. 8), to a cooling system. Alternatively, and equally acceptable, line 212 may be a return line from a cooling system, and line 206 may be a supply line, supplying coolant/refrigerant to a desired system.

Leaf assemblies 202 and 204 may be a single piece of material, or may be comprised of two or more sections (202*a*, 202*b* and 204*a*, 204*b*) for improved ease of mounting to electronics rack 10 and rack door 20, as well for ease of inclusion and orientation of return and supply lines 206 and 212. Screw holes 203 may be provided in these leafs for receiving appropriate attachment means, such as screws, for securing the leafs in their respective places on the door and on the frame, such as in mortises formed in one or both of rack frame 12 and door 20. Optionally, and equally acceptable, leafs 202 and 204 may be attached to the rack 10 and the rack door 20 using any attachment method known to those of skill in the art, including but not limited to welding.

With continued reference to FIG. 7, central barrel section 220 of the multi-position swivel hinge assembly 200 can be spatially separated from one (or both) leaf assemblies by an appropriate joining means, such as upper and lower joining arms 208 and 210, respectively. In accordance with one aspect of this aspect of the disclosure, a proximal end of the joining arm may circumscribe central barrel section 220, and may be attachable to the barrel by an appropriate attachment means, such as by way of a metal screw or the like. The distal end of the joining arm(s) may be formed with leaf sections 202, such as by casting, or may be welded to a face of the appropriate leaf section. Central barrel section 220 further comprises a top and bottom end, the bottom end comprising a throat section 218, and an end cap 222, which forms the bottom end of barrel section 220. The top end of section 220 comprises a throat section 216, as well as a seal collar 214 which circumscribes flow pipe 212. In accordance with certain aspects of the present disclosure, while not shown in the figure, the barrel section 220, acting as the hinge pin of the hinge assembly, may be attached to the door itself, by way of the outer sleeve portions, so as to allow the forces of opening and closing the door to act primarily on the barrel section 220 itself, and less on the interior flow lines, ball valve, and/or seals. For example, in accordance with this aspect and depending upon the orientation of the swivel hinge assembly 200 in relation to the frame of the electronics rack 10 and the rack door 20, if leaf assembly 204 is attached to the electronics frame/rack 10, then the thrust bearing would need to be placed intermediate between throat section 218 and leaf assembly 204*b*. However, if, as illustrated in FIG. 7, the leaf assembly 202 is attached to the electronics frame/rack 10, then the trust bearing would need to be placed between throat section 216 and hinge leaf 204*a*.

Turning now to FIG. 8, a partial cross-section of the swivel hinge assembly of FIG. 7 is illustrated. As can be seen from the figure, the hinge body of swivel hinge assembly 200 may comprise top and bottom sleeve portions 220*a* and 220*b*, respectively, which may be interconnected in any appropriate manner, such as by threadable, brazed joints as shown, or equivalent connection means. Housed within the interior of sleeve portions 220*a* and 220*b* is a ball 300, which as illustrated serves to interconnect return and supply lines 206 and 212. Either flow pipe 212 itself, or alternatively flow pipe 206, may be mechanically bonded (e.g., by welding, brazing, or similar mechanical bonding means) to the ball 300 using any appropriate bonding methods, thereby ensuring that the only leak path for the coolant is past the ball seat/seal(s) 230*a* and/or 230*b*. Thus, and in accordance with some aspects of the present disclosure, ball 300 may be mechanically bonded directly to the vertical flow pipe 212. As a result, the ball 300 swivels relative to the barrel 220, allowing the rack door 20 to be opened and closed freely with minimal concerns of interrupting coolant flow in and around the electronics rack 10.

Also housed within the interior of the barrel section 220 are upper and lower primary seals, 230*a* and 230*b*, which act to seat and retain ball 300 in position without providing undue strain to supply lines 206 and 212 during operation of the swivel hinge assembly. Primary seals 230*a* and 230*b* may be made from any suitable material, including but not limited to silicon or any number of elastomeric or polymeric materials, as well as metal materials (e.g., steel, stainless steel, carbon steel, and steel alloys) so as to form metallic seals or metal plated (e.g., tin plated) ball seals, and may be in any appropriate shape or size, such as O-rings. Typically, but without limitation, seals 230*a* and 230*b* are oriented such that they circumscribe the ball 300 at about the upper ⅓ and lower ⅓ of the substantially spherical surface of ball 300, so as to provide maximum protection, retainment, and/or seating to the ball. As will be clear to those of skill in the art, the use of ball 300 allows for the flow of refrigerant or coolant fluid to remain substantially continuous, even when the hinge is rotating during the course of door opening or closing.

Upper collar 214 acts to compress the seals within the hinge assembly, such as the seals (O-rings) 228 directly below them when a door is opened or closed. For example, with reference to FIG. 8, seals 228 may be compressed when the door 20 is closed. Then, a mechanism, perhaps actuated by a latch, may raise the collar 214 slightly and allow the seals (e.g., 228) to decompress when the door is to be opened, thus allowing for easier rotation of the door on the hinge assembly 200. At a later point in time, when the user closes and latches the door, the collar 214 would again be pushed down, thereby compressing the seals 228, and consequently providing a stronger seal. This compression feature of upper collar 214 will depend upon the mounting orientation of the hinge assembly 200 between the cabinet and the door. Cap 222 may be welded or threaded onto 220, depending upon the situation. It should be noted that cap 222 may be welded or threaded onto 220 only in such non-limiting situations as illustrated in FIG. 8. In a situation where fluid flow would be both out of the top and bottom of the hinge assembly (not shown), wherein the bottom of the assembly would mirror the top of the assembly illustrated in FIG. 8, cap 222 would be replaced by collar 214, which would need to move up and down relative to barrel 220, as described above.

Regardless of the arrangement, such compression can be activated in a number of manners, including but not limited to a door latch assembly. In this instance, as referenced generally above, the seal would be compressed when the door is latched, and uncompressed when the latch is released, allowing for easier swivel action of the hinge assembly. Also integral to maintaining the compression and sealability of the swivel hinge assembly 200 so that coolant fluid may flow uninterrupted through the assembly, are secondary O-ring seals 228 and thrust bearing 226. Collar 214 may be designed so that it physically rotates, swivels, raises or lowers during operation of the hinge assembly, allowing for substantially continuous fluid flow throughout the full range of the swing of the door. For example, as suggested above, a linking mechanism may be employed to communicate with the collar 214 when the door is latched or unlatched. When the door is unlatched, the linking mechanism may raise the collar 214, and lower collar 214 again once the door is latched. In this way, collar 214 may act to compress seals 228 when the door is closed, and decompress seals 228 when the door is being opened and is swiveling on hinge assembly 200. As suggested above, whether the collar 214 is used on the top, the bottom, or both the top and the bottom will depend upon the orientation of the hinge assembly 200. Thus, collar 214 may act to decrease friction within the hinge assembly during the course of typical, swivel hinge operation, while simultaneously preventing leakage from the fluid flow path inside the hinge assembly 200.

Hinge assembly 200 may be made of any appropriate material, such as forged metals like brass, or any other suitable material which will allow for the transfer of fluids having a temperature ranging from about −300° F. (about −184° C.) up to about 300° F. (about 148° C.), and a working pressure flow ranging from about 10 psi to about 1,000 psi, such as about 610 psi. The primary seals 230*a,b* and secondary O-rings may be made of any number of known materials that will provide a sealing force, including but not limited to elastomeric materials, rubbers, and PTFE (polytetrafluoroethylene, TEFLON®).

FIG. 9 illustrates further details of the ball 300, suitable for use within the swivel hinge assembly 200 of FIG. 7. As shown therein, the ball 300 may be substantially spherically in shape, having a plurality of orifices 302*a*, 302*b*, 302*c* shaped so as to accommodate the swivel action of the ball valve and the swivel hinge, the orifices at least partially defining inlet and/or outlet flow passages through the valve. Orifice 304 of ball 300 is the opening where a mechanical connection is made between ball 300 and flow pipe 212. While the ball 300 is shown to have three orifices 302, it may have more or less, depending upon the specific configuration of the swivel hinge. In accordance with one non-limiting aspect of the present disclosure, orifices 302 may be, as illustrated in FIG. 9, substantially circular in shape, or they may have an oblong (oval) shape or arcuate elongated shape, as desired, so as to further accommodate and enhance the swivel action of the ball 300 during the course of operation. Additionally, the inclusion of such oblong, arcuate elongated orifices of each flow passage may work such that, in use, as the ball 300 rotates, the arcuate elongate orifice of each flow passage which is exposed is fully or substantially fully opened before the next passage is opened.

While not illustrated herein, a number of alternative, yet equally acceptable refrigerant ball valves suitable for use with the hinge assemblies 200 of the present disclosure may be envisioned, depending upon the nature of the fluid flowing within the cooling system, and the desired utility of the end user. For example, and without limitation, it may be envisioned that a three-way ball comprising a substantially spherically-shaped body similar to that illustrated in FIG. 9 may be included in hinge assembly 200, the ball having a first port, a second port and a third port oriented in directions perpendicular to an axis extending through the orifice which is mechanically bonded to the fluid flow pipe. Further, it is envisioned that such balls for use with the presently disclosed swivel hinges may include one or more impedance assemblies (not shown) that may be positioned, at least in part, within one or more of the bores of the ball. Such an impedance assembly may include, without limitation, grooves, channels, holes, or similar flow control or flow directing passages or structures through the impedance assembly, on the surface of the impedance assembly, or both. In this manner, the flow of a fluid through swivel hinge assemblies 200 may be slowed as desired.

The hinges described herein are capable of conveying a fluid, liquid, or combination of two or more fluids or liquids, including gaseous fluids, from a cooling assembly, such as a cooling coil, to a circulating system within a hardware rack, such as a rack for computer assemblies. Suitable liquids for use with the hinge assemblies described herein include but are not limited to any number of appropriate coolants or refrigerants, including liquid coolants such as liquid water (also referred to as a non-evaporating or "phase change" coolant), water-methanol solutions, and Freon® (any of a number of several chlorofluorocarbons used in commerce and industry, numerous of which are aliphatic organic compounds containing at least carbon and fluorine, such as HFC and HCFC), hydrofluorocarbons, such as the SUVA® brand of refrigerants (DuPont), bis-(difluoromethyl)ether refrigerants, carbon dioxide ($CO_2$), including gaseous carbon dioxide, transcritical carbon dioxide, and liquid $CO_2$, or hybrid coolants such as the Liebert XD® Coolant refrigerant system (Liebert Corporation, Columbus, Ohio), wherein the coolant is a gas at atmospheric temperature and/or pressure, but can be pumped as a liquid. Such hybrid coolants are preferred for use in association with computer systems, as the fluid phase-change greatly enhances the system's efficiency, while simultaneously eliminating the possibility of damage or electrical hazard from liquid in the event that a leak forms, since in such a case it would emit only an environmentally friendly "green" gas. In further aspects of the present invention, the liquid or fluid for use within the hinge assemblies described herein include liquid metal coolants, including both low-melting point metals for computer rack cooling applications, or higher melting point metals for other applications that are unrelated to computer racks. Suitable liquid metal coolants include, but are not limited to, Na, K, Na—K, Cs, Li, Na—K—Cs alloys, Ga, mixed metal systems such as $Ga^{61}In^{25}Sn^{13}$ and Pb—Bi eutectics, as well those liquid metals or metal combinations having a high thermal conductivity, such as described and referenced by Miner, A., et al. [*Applied Physics Letters*, Vol. 85 (3): pp. 506-508 (2004)].

In alternative embodiments of the present disclosure not illustrated herein, a cabinet or frame similar to frame 10 can have a cooling assembly 30 hingably attached to one or more faces of the rack in order to cool components within the rack, wherein the cooling assembly 30 is not fastened to a door, but is hingably attached to the rack independently, via a hinge assembly 50 as described herein.

Further alternative embodiments of the present disclosure include the use of the hinges and hinge assemblies described herein in generating a wall partition or room dividing assembly comprised of a plurality of wall panels, wherein the hinge assemblies described herein act as the hingable connecting means that interconnect the plurality of wall panels. In further accordance with this aspect, several (or all) of the plurality of wall panels can comprise cooling assemblies, such as cooling assembly 30, so as to function to create an isolated "cold room", as appropriate. Additionally, and without limitation, it is envisioned that the swivel hinge assemblies of the present disclosure may be optionally used in combination with, or in a system that includes the use of, refrigerant connectors, such that the connectors provide a quick disconnection and connection option for bringing the coolant system within rack 10 and cooling assembly 30 on the door into fluid communication.

While compositions and methods are described in terms of "comprising" various components or steps (interpreted as meaning "including, but not limited to"), the compositions and methods can also "consist essentially of" or "consist of" the various components and steps, such terminology should be interpreted as defining essentially closed-member groups.

The invention has been described in the context of preferred and other embodiments and not every embodiment of the invention has been described. Obvious modifications and alterations to the described embodiments are available to those of ordinary skill in the art. The disclosed and undisclosed embodiments are not intended to limit or restrict the scope or applicability of the invention conceived of by the Applicants, but rather, in conformity with the patent laws, Applicants intends to protect all such modifications and improvements to the full extent that such falls within the scope or range of equivalent of the following claims.

What is claimed is:

1. A swivel hinge assembly comprising:
a first relatively stationary base member and a second relatively stationary base member;
a first swivel member that is integral with the first relatively stationary base member;
a second swivel member that is integral with the second relatively stationary base member;
a channel extending through both the first swivel member and the second swivel member and providing fluid communication between the first and second swivel members;
wherein the first base member and the first swivel member include a swivel shaft and the second base member and the second swivel member include at least one aperture in which the swivel shaft is journaled for rotation;
wherein the first swivel member and the second swivel member are rotatable about a longitudinal axis passing through the swivel shaft; and
wherein at least one of the first and second swivel members is at least partially within an associated base member.

2. The swivel hinge assembly of claim 1, wherein the first base member includes means for engaging a first external object and the second base member includes means for engaging a second external object.

3. The swivel hinge assembly of claim 2, wherein the means for engaging a second external object includes a portion of shaped section formed on the second base member and integral with the second swivel member.

4. The swivel hinge assembly of claim 1, further comprising one or more load bearing elements.

5. The swivel hinge assembly of claim 1, wherein the first and second swivel members can rotate continuously from about 0° to about 360°.

6. The swivel hinge assembly of claim 1, wherein the first and second swivel members can rotate continuously from about 0° to about 360° in a continuous number of rotations.

7. A system for use in cooling heat-generating components housed within an electronics rack, the system comprising:
an electronics rack having a frame comprising one or more sides, a top, and a base;
a closure assembly for the electronics rack comprising an inside face and an outside face;
a heat exchanger;
coolant fluid supply pipes capable of conveying a fluid coolant; and
a swivel hinge assembly in accordance with claim 1,
wherein the swivel hinge assembly is located intermediate between the frame and the closure assembly and provides fluid communication between the coolant fluid supply pipes and the heat exchanger.

8. The system of claim 7, wherein the system comprises two or more swivel hinge assemblies.

9. The system of claim 7, wherein the swivel hinge assembly is attached to the frame of the electronics rack by a mechanical attachment means.

10. The system of claim 7, wherein the heat exchanger is mounted to the closure assembly.

11. The system of claim 10, wherein the heat exchanger is mounted to the inside face of the closure assembly.

12. The system of claim 10, wherein the heat exchanger is mounted to the outside face of the closure assembly.

13. The system of claim 7, further comprising two or more heat exchangers, each heat exchanger mounted to either the inside face or the outside face of the closure assembly.

14. The system of claim 7, wherein the heat exchanger comprises a coil condenser, a heat rejection unit, or both.

15. The system of claim 7, further comprising a coolant distribution unit comprising a coolant circulating unit and a heat source located within the electronics rack, and in fluid communication with each other.

16. The system of claim 7, further comprising a condenser system remotely located from the electronics rack and fluidicly coupled to the heat exchanger.

* * * * *